US012593725B2

(12) United States Patent
Ho et al.

(10) Patent No.: US 12,593,725 B2
(45) Date of Patent: Mar. 31, 2026

(54) ELECTRONIC DEVICE

(71) Applicant: Innolux Corporation, Miao-Li County (TW)

(72) Inventors: Chia-Chi Ho, Miao-Li County (TW); Jen-Hai Chi, Miao-Li County (TW); Chin-Lung Ting, Miao-Li County (TW)

(73) Assignee: Innolux Corporation, Miaoli County (TW)

( * ) Notice: Subject to any disclaimer, the term of this patent is extended or adjusted under 35 U.S.C. 154(b) by 866 days.

(21) Appl. No.: 17/844,744

(22) Filed: Jun. 21, 2022

(65) Prior Publication Data

US 2023/0026864 A1    Jan. 26, 2023

Related U.S. Application Data

(60) Provisional application No. 63/221,003, filed on Jul. 13, 2021.

(30) Foreign Application Priority Data

Apr. 13, 2022    (CN) .......................... 202210386206.7

(51) Int. Cl.
*H01L 25/16*      (2023.01)
*H01L 23/00*      (2006.01)
*H01L 23/10*      (2006.01)
*H01L 23/16*      (2006.01)

(52) U.S. Cl.
CPC ............ *H01L 25/165* (2013.01); *H01L 23/10* (2013.01); *H01L 23/16* (2013.01); *H01L 24/16* (2013.01); *H01L 24/32* (2013.01); *H01L 2224/16227* (2013.01); *H01L 2224/32225* (2013.01)

(58) Field of Classification Search
CPC ................... H01L 25/165; H01L 23/10; H01L 2224/32225; H01L 23/043; H01L 23/053; H01L 25/167; H10H 20/85; H10H 20/852; H10H 20/854; H10K 59/872; H10K 50/842
See application file for complete search history.

(56) References Cited

U.S. PATENT DOCUMENTS

| | | | | |
|---|---|---|---|---|
| 2014/0217523 A1* | 8/2014 | Kubiak | ................... | H10D 48/50 |
| | | | | 257/419 |
| 2019/0054309 A1* | 2/2019 | Van Der Weide | ........ | A61F 7/00 |
| 2020/0036081 A1* | 1/2020 | Li | ........................ | H01L 23/3135 |

(Continued)

FOREIGN PATENT DOCUMENTS

| | | |
|---|---|---|
| CN | 110783687 | 2/2020 |
| TW | 200304186 | 9/2003 |

OTHER PUBLICATIONS

"Search Report of Europe Counterpart Application", issued on Apr. 3, 2023, p. 1-p. 13.

(Continued)

*Primary Examiner* — Wasiul Haider
(74) *Attorney, Agent, or Firm* — JCIPRNET

(57)    ABSTRACT

Provided is an electronic device including a substrate, a first metal layer, an electronic component, a cover layer, and an adhesive layer. The first metal layer is formed on the substrate. The electronic component is disposed on the substrate and electrically connected to the first metal layer. The adhesive layer is adhered to the substrate and the cover layer.

19 Claims, 6 Drawing Sheets

(56)     References Cited

U.S. PATENT DOCUMENTS

| 2020/0066698 A1* | 2/2020 | Huang | H10H 20/857 |
| 2020/0286983 A1* | 9/2020 | Liu | H01L 23/642 |
| 2020/0335453 A1* | 10/2020 | Hong | H01L 23/49838 |
| 2020/0411419 A1* | 12/2020 | Hatori | H01L 23/49582 |
| 2021/0043573 A1 | 2/2021 | Eid et al. | |
| 2021/0043813 A1* | 2/2021 | Reeswinkel | C08L 83/04 |
| 2021/0066162 A1 | 3/2021 | Chan Arguedas et al. | |

OTHER PUBLICATIONS

"Partial Search Report of Europe Counterpart Application", issued on Dec. 7, 2022, p. 1-p. 13.
"Office Action of Taiwan Counterpart Application", issued on Mar. 15, 2023, p. 1-p. 5.

* cited by examiner

ELECTRONIC DEVICE

CROSS-REFERENCE TO RELATED APPLICATION

This application claims the priority benefits of U.S. provisional application Ser. No. 63/221,003, filed on Jul. 13, 2021, and China application serial no. 202210386206.7, filed on Apr. 13, 2022. The entirety of each of the above-mentioned patent applications is hereby incorporated by reference herein and made a part of this specification.

BACKGROUND

Technical Field

The disclosure relates to an electronic device.

Description of Related Art

Electronic devices are universal with its application in various fields, and outdoor spaces are one where the electronic devices may be applied and installed. Therefore, the environmental reliability of electronic devices is an issue to be paid attention to.

SUMMARY

According to an embodiment of the present disclosure, an electronic device includes a substrate, a first metal layer, an electronic component, a cover layer, and an adhesive layer. The first metal layer is formed on the substrate. The electronic component is disposed on the substrate and electrically connected to the first metal layer. The adhesive layer is adhered to the substrate and the cover layer.

To make the above-mentioned features and advantages of the disclosure more comprehensible, the following specific embodiments are described in detail with reference to the following drawings.

BRIEF DESCRIPTION OF THE DRAWING

The drawings are included for further understanding of the disclosure, and the drawings are incorporated into this specification and constitute a part of this specification. The drawings illustrate the embodiments of the disclosure, and together with the description are used to explain the principles of the disclosure.

DESCRIPTION OF THE EMBODIMENTS

Figure 1:
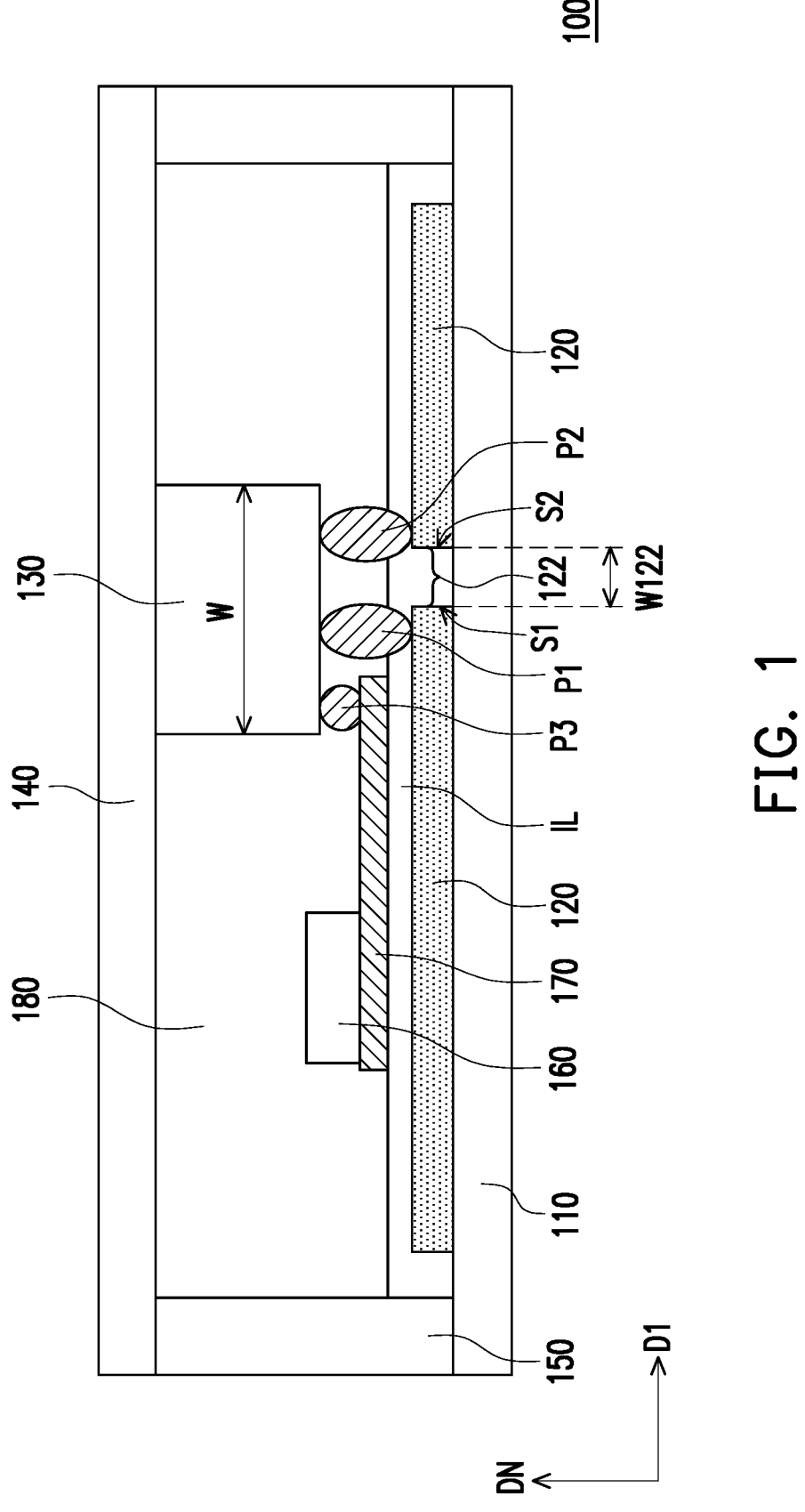
FIG. 1 is a schematic partial cross-sectional view of an electronic device according to an embodiment of the disclosure.

The present disclosure may be understood by referring to the following detailed description in conjunction with the drawings. For readers' understanding and the brevity of the drawings, the drawings of this disclosure only depict part of a light-emitting device, and the specific elements in the drawings are not drawn according to actual scale. In addition, the number and size of each element in the drawings are only for schematic purposes and do not limit the scope of the disclosure.

Throughout the disclosure and the claims, certain words are used to refer to specific elements. Those skilled in the art should understand that electronic device manufacturers may refer to the same components by different names. This article does not intend to distinguish those elements with the same function but different names. In the following description and claims, the words "having" and "including" are open-ended words, so they should be interpreted as meaning "including but the disclosure is not limited to." Therefore, when the terms "including," "containing" and/or "having" are used in the description of the present disclosure, they specify the existence of corresponding features, regions, steps, operations, and/or components, but do not exclude one or more existence of corresponding features, regions, steps, operations, and/or components.

When an element or a film layer is referred to as being "on" or "connected" to another element or film layer, it may be directly on or directly connected to the other element or film layer. Or, there may be an element or film layer intervening between the two (in the case of indirect contact). Conversely, when an element is referred to as being "directly" on or "directly connected" to another element or film layer, there is no element or film layer intervening between the two. In addition, when an element is referred to as "on another element," the two are above or below each other in the top view direction, and this element may be above or below the other element, and this above-or-below relationship depends on the orientation of the device.

Although the terms "first," "second," "third," and the likes may be used to describe various constituent elements, the constituent elements are not limited to these terms. This term is only used to distinguish a single constituent element from other constituent elements in the specification. The same terms may not be used in the claims, and the elements in the claims may be replaced with first, second, third and the likes according to the order declared by the elements in the claims. Therefore, in the following description, the first constituent element may be the second constituent element in the claims.

In the text, the terms "about," "approximately," "substantially," and "substantially" usually mean it is within 10%, 5%, 3%, or 2%, 1%, or 0.5% of a given value or range. The quantity given here is an approximate quantity. In other words, in the absence of a specific description for the terms "about," "approximately," "substantially" or "approximately," "about," and "approximately," the meaning of "substantially" and "substantially" is still implied. In addition, the descriptions "ranging from the first value to the second value" and "between the first value and the second value" imply that the range includes the first value, the second value, and other values in between.

In some embodiments of the present disclosure, terms related to bonding and connection, such as "connected," "interconnected," unless specifically defined, it mean that two structures are in direct contact, or that two structures are not in direct contact and there are other structures located between these two structures. And the terms about joining and connecting can also include the case where both structures are movable or both structures are fixed. In addition, the term "coupled" includes any direct and indirect electrical connection means.

In this disclosure, the thickness, length, and width may be measured by using an optical microscope, and the thickness may be measured by a cross-sectional image in an electron microscope, but it is not limited thereto. In addition, there may be a certain margin in any two values or directions used for comparison. If the first value is equal to the second value, it implies that there may be a margin of about 10% between the first value and the second value; if the first direction is perpendicular to the second direction, the angle between the first direction and the second direction may be between 80 degrees and 100 degrees; if the first direction is parallel to the second direction, the angle between the first direction and the second direction may be between 0 degrees and 10 degrees. Without further definitions, all terms (technical and scientific terms included) used herein have the same meanings as commonly understood by those skilled in the art to which this disclosure belongs. It is understandable that these terms, such as those defined in commonly used dictionaries, should be interpreted as having meaning consistent with the relevant technology and the background or context of this disclosure, and should not be interpreted in an idealized or excessively formal way, unless a specific definition is provided in the embodiment of the present disclosure.

The display panel of the present disclosure may be applied to electronic devices such as display devices, antenna devices (e.g., liquid crystal antennas), sensing devices, light-emitting devices, touch devices, splicing devices, or any combination of the foregoing, but the disclosure is not limited thereto. The electronic device may include a bendable and flexible electronic device. The appearance of the electronic device may include a rectangle, a circle, a polygon, a shape with a curved edge, or other suitable shapes. The display device may, for example, include light-emitting diodes (LEDs), liquid crystal (fluorescence), phosphor (phosphor), quantum dot (QD), other suitable materials, or a combination of the foregoing, but the disclosure is not limited thereto. Light-emitting diodes may include, for example, organic light-emitting diodes (OLED), inorganic light-emitting diodes, sub-millimeter light-emitting diodes (mini LEDs), micro LEDs, or quantum dot light-emitting diodes (QLED or QDLED), other suitable materials, or any combination of the above, but the disclosure is not limited thereto. The appearance of the electronic device may have rectangular, circular, polygonal shape, a shape with curved edges, or other suitable shapes. The electronic device may have peripheral systems such as a driving system, a control system, a light source system, a shelf system, to support a display device, an antenna device, or a splicing device. Hereinafter, the display panel will be adapted to illustrate the content of the disclosure, but the disclosure is not limited thereto.

It should be understood that the following embodiments may be substituted, reorganized, and mixed to complete other embodiments without departing from the spirit of the present disclosure. The features between the embodiments may be mixed and matched arbitrarily as long as they do not violate or in conflict with the spirit of the disclosure.

Reference will now be made in detail to the exemplary embodiments of the present disclosure, and examples of the exemplary embodiments are illustrated in the drawings. The same reference symbols may be used to denote the same or similar parts in the drawings and the description.

FIG. 1 is a schematic partial cross-sectional view of an electronic device according to an embodiment of the disclosure. As shown in FIG. 1, the electronic device 100 includes a substrate 110, a first metal layer 120, an electronic component 130, a cover layer 140, and an adhesive layer 150. The first metal layer 120 is formed on the substrate 110. The electronic component 130 is disposed on the substrate 110 and is electrically connected to the first metal layer 120. The adhesive layer 150 is adhered to the substrate 110 and the cover layer 140. The cover layer 140 and the substrate 110 are disposed opposite to each other, and the first metal layer 120 and the electronic component 130 are located between the substrate and the cover layer 140. The adhesive layer 150 is adapted to bring the substrate 110 and the cover layer 140 together. In some embodiments, the adhesive layer 150 is disposed on the periphery of the electronic device 100 and may be in a ring-shaped pattern (e.g., from the top view). In this way, the substrate 110, the cover layer 140, and the adhesive layer 150 surround the electronic component 130 and the first metal layer 120. By encapsulating the electronic component 130, the first metal layer 120, or other components formed on the substrate, the external influence from moisture or oxygen on the electronic component 130 may be reduced, thereby improving the reliability of the electronic device, but the disclosure is not limited thereto. In other embodiments, the electronic component 130 may be covered in other ways, such that at least one of the cover layer 140 and the adhesive layer 150 may be omitted. For example, an encapsulation layer may be formed on the substrate 110 to surround the electronic components 130 or other components formed on the substrate, and at least one of the cover layer 140 and the adhesive layer 150 may be thus omitted, but the disclosure is not limited thereto. The material of the encapsulation layer may be light-transmitting or opaque.

The substrate 110 may be a glass substrate, a ceramic substrate, a plastic substrate, or other elements with sufficient supporting properties. For example, the material of the substrate 110 may include glass, quartz, organic polymer, opaque/reflective material (e.g., conductive material, metal, wafer, ceramic, or other materials applicable), a single layer or a stack of one of the applicable materials, or a stack or a mixture of at least two of the above materials, but the disclosure is not limited thereto. Here, the plastic substrates that may be used as the substrate 110 include, but are not limited to, polyimide substrates, liquid crystal polymer substrates, cyclo olefin polymer (COP) substrates, polymethyl methacrylate (PMMA) substrate, polycarbonate (PC) substrate, poly tetra fluoroethylene, (PTFE), but the disclosure is not limited thereto.

In some embodiments, the electronic device 100 is a device capable of receiving various electromagnetic wave bandwidths, such as an antenna device. The first metal layer 120 is, for example, a ground metal layer, and the first metal layer 120 is disposed on the substrate 110, occupying a large area of the substrate. For example, the first metal layer 120 may occupy 80% to 90% of the area of the substrate 110. The first metal layer 120 may be stacked on the substrate 110. In some embodiments, the first metal layer 120 may be formed on the substrate 110 by deposition, printing, electroplating, or the like. For example, in terms of deposition, the first metal layer 120 may be formed on the substrate 110 by sputtering, evaporation, or the like. The material of the first metal layer 120 includes copper, tin, nickel, or other metals. In some embodiments, the first metal layer 120 may be a copper layer electroplated on the substrate 110, but the disclosure is not limited thereto.

The first metal layer 120 may have a plurality of openings 122, but FIG. 1 only shows one opening 122 for convenience of description. In some embodiments, the first metal layer 120 on both sides of the opening 122 is continuous and electrically grounded. In other words, the openings 122 may be closed patterns and are surrounded by the material of the first metal layer 120. The width W122 of the opening 122 may be related to the wavelength of the electromagnetic wave signal receivable/transmittable by the electronic device 100. Therefore, the width W122 of the opening 122 may be determined based on the function of the electronic device 100 as required.

The location of the electronic component 130 may correspond to the opening 122 of the first metal layer 110. Specifically, in the normal direction DN of the substrate 110, the electronic components 130 overlap the openings 122. In FIG. 1, a first direction D1 is perpendicular to the normal direction DN, the electronic component 130 has a width W in the first direction D1, the opening 122 has a width W122 in the first direction D1, and the width W is greater than the width W122. In some embodiments, the electronic component 130 may overlap the first metal layer 120 on one side S1 of the opening 122 and also overlap the first metal layer 120 on the other side S2 of the opening 122. The electronic component 130 may be electrically connected to the first metal layer 120. Specifically, the electronic component 130 is electrically connected to the first metal layer 120 through the corresponding bonding pads P1 and P2, the electronic component 130 is disposed on the substrate 110. In some embodiments, the electronic component 130 may be bonded and fixed to the substrate 110 through pads or adhesive, but the disclosure is not limited thereto. In some embodiments, electronic components 130 may include capacitors, semiconductor wafers, and the like. The electronic component 130 may be, for example, a varactor or an integrated circuit (IC) chip, but the disclosure is not limited thereto.

The cover layer 140 may have a plate-like structure, but the disclosure is not limited thereto. In some embodiments, the cover layer 140 may be a glass substrate, a ceramic substrate, a polyimide substrate, a liquid crystal polymer substrate, a cyclo olefin polymer (COP) substrate, an acrylic substrate (e.g., a polymethyl methacrylate (PMMA) substrate), a polycarbonate (PC) substrate, poly tetra fluoroethylene (PTFE), etc. The cover layer 140 and the substrate 110 may include the same material or of different materials. In some embodiments, the cover layer 140 may contact the electronic components 130. Furthermore, the cover layer 140 may contact an upper surface of the electronic component 130, such that the electronic component 130 maintains the distance between the substrate 110 and the cover layer 140, but the disclosure is not limited thereto.

The adhesive layer 150 is used for adhering the substrate 110 and the cover layer 140, that is, the substrate 110 and the cover layer 140 may be fixed to each other through the adhesive layer 150. The adhesive layer 150 may be disposed on the periphery of the electronic device 100. Therefore, the substrate 110, the cover layer 140, and the adhesive layer 150 enclose a space, and components such as the first metal layer 120 and the electronic component 130 may be disposed in the space surrounded by the substrate 110, the cover layer 140, and the adhesive layer 150. The adhesive layer 150 may include a sealant material or other adhesive materials. The adhesive layer 150 may include a curable material, such as heat-curable glue, light-curable glue, and the like. The outer sidewalls of the adhesive layer 150, the substrate 110, and the cover layer 140 may or may not be aligned with one another. In some embodiments, the cover layer 140 may be omitted and the electronic component 130 is directly covered with the adhesive layer 150, such that the electronic component 130 is covered by the adhesive layer 150 and the substrate 110.

In addition, the electronic device 100 further includes a transistor 160. The transistor 160 may be formed on the substrate 110 as shown in FIG. 1, but the disclosure is not limited thereto. In other embodiments, the transistor 160 may be formed on the cover layer 140. The transistor 160 may be electrically connected to the electronic component 130 to adjust or control the characteristics of the electronic component 130. For example, when the electronic component 130 is a varactor, the electronic component 130 may be electrically connected to the transistor 160 to adjust and control the capacitance of the electronic component 130 through the transistor 160. In this way, the capacitance of the transistor 160 can determine the frequency of the electromagnetic wave signal received/transmitted by the electronic device 100. In other words, the electronic device 100 is a device capable of receiving/transmitting electromagnetic wave signals of different frequencies. In some embodiments, the transistor 160 may be a thin film transistor (TFT), a separately packaged transistor, or other types of transistors. Take a thin film transistor as an example. The transistor 160 may a stack of multiple layers like a semiconductor layer, a multi-layer conductive layer, and a multi-layer insulating layer.

In some embodiments, the electronic device 100 further includes a second metal layer 170 formed on the substrate 110. The second metal layer 170 is adapted to connect the electronic component 130 electrically to the transistor 160. Please refer to the first metal layer 120 for the fabrication process and the material of the second metal layer 170, but the disclosure is not limited thereto. The second metal layer 170 and the first metal layer 120 may include the same material or of different materials. In addition, the electronic device 100 further includes a bonding pad P3 formed on the substrate 110, and the second metal layer 170 extends between the bonding pad P3 and the transistor 160. For example, the second metal layer 170 is disposed between at least one of the bonding pads (for example, P3) and the transistor 160, but the disclosure is not limited thereto. The electronic component 130 may be connected to the bonding pad P3 and is electrically connected to the transistor 160 through the bonding pad P3 and the second metal layer 160. In some embodiments, the electronic component 130 may be electrically connected to the first metal layer 120 through the bonding pads P1 and P2 and to the second metal layer 170 and the transistor 160 through the bonding pads P3, and thus the electronic component 130 may have three contacts, but the disclosure is not limited thereto. The bonding pads P1, the bonding pads P2, and the bonding pads P3 are, for example, solder, but the disclosure is not limited thereto. For example, the second metal layer 170 and the transistor 160 may be formed on the cover layer 140, and then the substrate 110 and the cover layer 140 may be joined through the adhesive layer 150, but the disclosure is not limited thereto.

The first metal layer 120 is disposed between the second metal layer 170 and the substrate 110, and as shown in FIG. 1, the electronic device 100 further includes an insulating layer IL disposed between the first metal layer 120 and the second metal layer 170. The insulating layer IL may include insulating materials such as inorganic insulating materials and organic insulating materials. In some embodiments, the insulating layer IL may be a multilayer structure layer including multiple insulating materials stacked together. Inorganic insulating materials include, for example, silicon oxide ($SiO_x$), silicon nitride ($SiN_x$), silicon oxide nitride $(SiO_xN_y)$, and inorganic insulating materials include, for example, polyimide, photoresist, planar layer materials, but the disclosure is not limited thereto.

In some embodiments, components such as electronic components 130 and transistors 160 are disposed between the substrate 110 and the cover layer 140, and the substrate 110 and the cover layer 140 are adhered to the two opposite sides of the adhesive layer 150, which forms a configuration that encloses the electronic component 130 and the transistor 160 in the space surrounded by the adhesive layer 150, the substrate 110, and the cover layer 140 that shield the electronic component 130 and the transistor 160 from damage. Additionally, the electronic device 100 may further include a filler 180. The filler 180 is interposed between the substrate 110 and the cover layer 140. The filler 180 may include a material with a low dielectric constant (Dk) or a material with a low dielectric loss (Df), and the dielectric loss coefficient of the filler 180 is greater than 0 and less than or equal to 4 at high frequencies (e.g., at 1 GHz). In some embodiments, the dielectric loss coefficient of the filler 180 is, for example, greater than 0 and less than or equal to 3.5, but the disclosure is not limited thereto. The propagation delay of the signal depends on the size of the dielectric constant, the size of the dielectric loss coefficient, and the structure of the transmission line. For example, as the propagation time is proportional to the square root of the dielectric constant, a substrate material with a low dielectric constant can reduce the propagation delay of the signal, or reduce the coupling capacitance between the wires, thereby reducing the cross talk between the signals, but the disclosure is not limited thereto. It is possible that the configuration of the filler 180 in some embodiments does not affect the electrical properties of the electronic component 130 and the transmission and reception of electromagnetic waves by the electronic device 100. The filler 180 may be air or other gas (e.g., inert gas) in some embodiments. The filler 180 may be glue in some embodiments. The filler 180 may be an Ajinomoto build-up film (ABF) in some embodiments. The filler 180 may be bismaleimide-triazine (BT) in some embodiments. The filler 180 may include a liquid material in some embodiments. The filler 180 may fill the volume between the substrate 110 and the cover layer 140, but the disclosure is not limited thereto. For example, there may be voids between the electronic component 130 and the bonding pads P1 to P3, and the voids are not fully filled by the filler 180, but the disclosure is not limited thereto.

In some embodiments, electronic components such as the electronic component 130 and the transistor 160 may be encapsulated by the substrate 110, the cover layer 140, the adhesive layer 150, and the filler 180, such that the electronic components 130 and the transistor 160 may not be easily damped or oxidized, and therefore not easily damaged. In some embodiments, the electronic device 100 may be a packaged device capable of transceiving electromagnetic waves of multiple frequencies.

Figure 2:
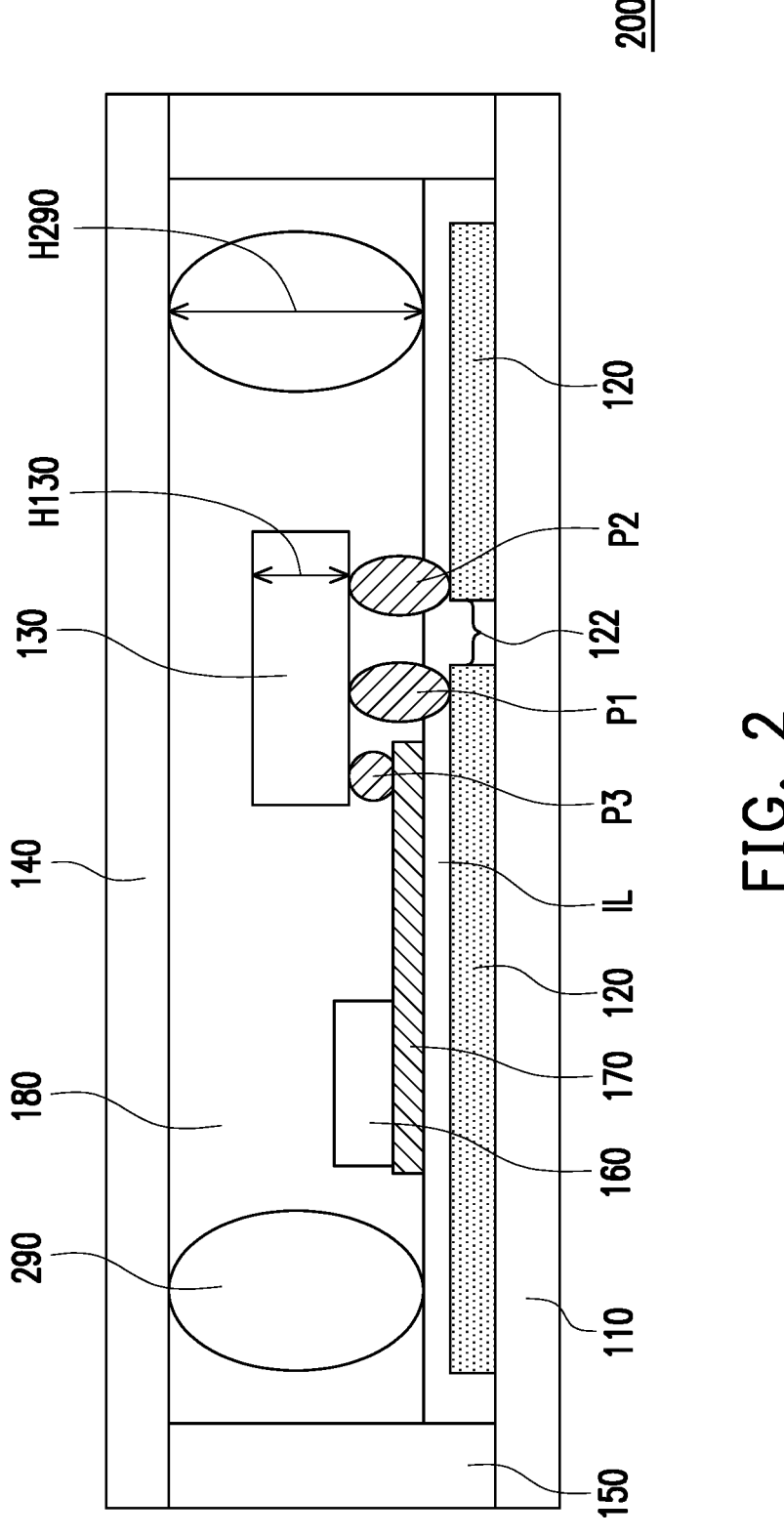
FIG. 2 is a schematic partial cross-sectional view of an electronic device according to an embodiment of the disclosure.

FIG. 2 is a schematic partial cross-sectional view of an electronic device according to an embodiment of the disclosure. The electronic device 200 of FIG. 2 is substantially similar to the electronic device 100 of FIG. 1, and the same reference numerals in the two embodiments may denote the same and/or similar elements, and one may be the reference of the other. The electronic device 200 includes a substrate 110, a first metal layer 120, an electronic component 130, a cover layer 140, an adhesive layer 150, a transistor 160, a second metal layer 170, a filler 180, and an insulating layer IL. In FIG. 2, the electronic device 200 further includes a spacer 290. The spacer 290 is disposed between the substrate 110 and the cover layer 140. In some embodiments, the spacer 290 maintains a distance between the substrate 110 and the cover layer 140, such that the cover layer 140 does not contact and/or press against the electronic component 130. For example, the height H290 of the spacer 290 may be greater than the height H130 of the electronic component 130. In some embodiments, when the electronic component 130 is a semiconductor wafer, the height H130 is, for example, 0.2 mm to 0.5 mm. As such, the height H290 of the spacer 290 is, for example, on the order of millimeters or sub-millimeters. The spacers 290 may be spherical, and the spacers 290 may be distributed in the electronic device 100 regularly or randomly. The spacer 290 may be other forms of spacers in other embodiments.

Figure 3:
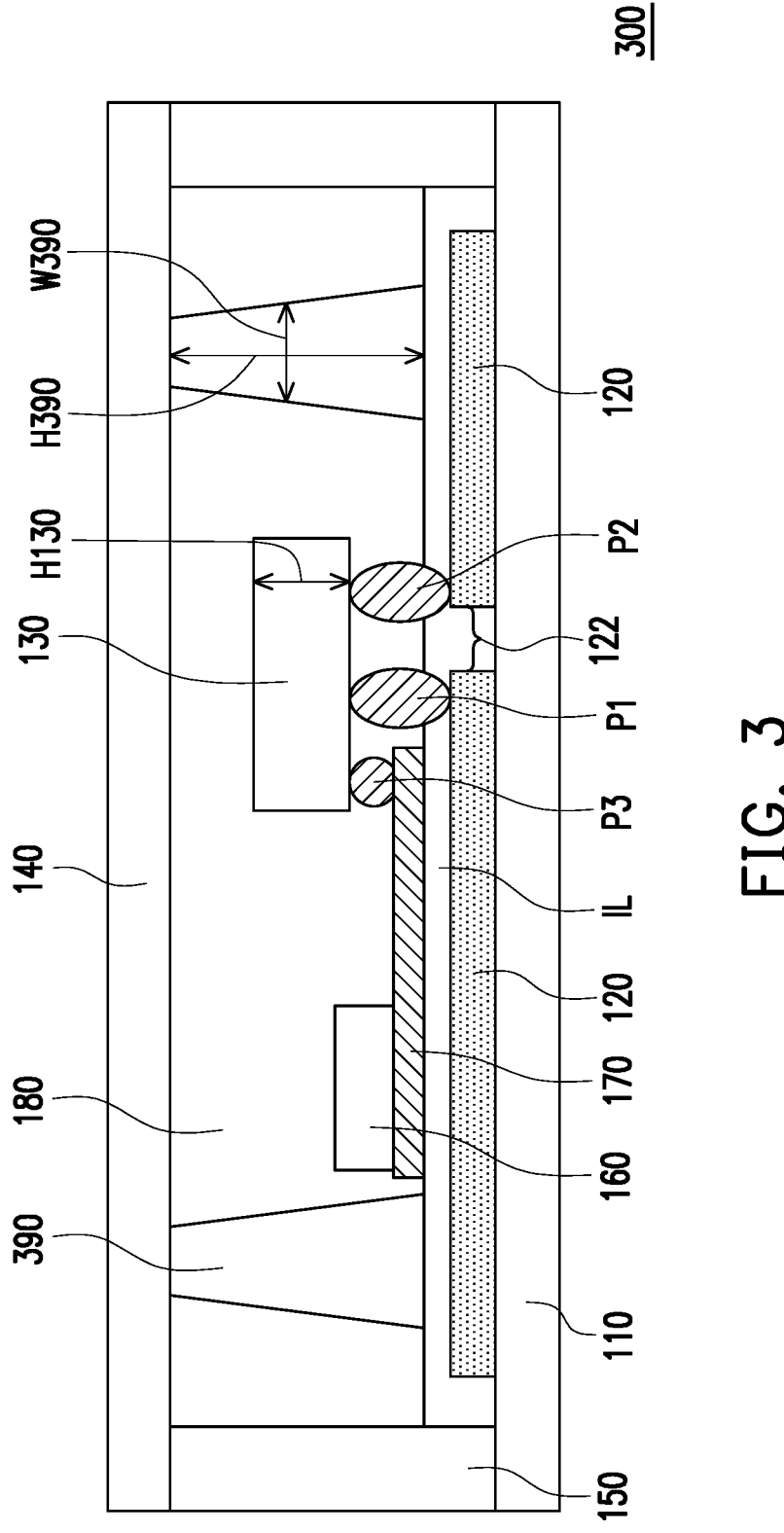
FIG. 3 is a schematic partial cross-sectional view of an electronic device according to an embodiment of the disclosure.

FIG. 3 is a schematic partial cross-sectional view of an electronic device according to an embodiment of the disclosure. The electronic device 300 of FIG. 2 is substantially similar to the electronic device 200 of FIG. 2, and the same referential numerals may represent the same and/or similar elements in the two embodiments. The electronic device 300 includes a substrate 110, a first metal layer 120, an electronic component 130, a cover layer 140, an adhesive layer 150, a transistor 160, a second metal layer 170, a filler 180, a spacer 390, and an insulating layer IL. The electronic device 300 is different from the electronic device 200 mainly specifically in the aspect of the spacer 390, and the rest of the elements of the electronic device 300 may be referred to the descriptions of FIG. 1 and FIG. 2. In some embodiments, the spacer 390 is, for example, a columnar spacer. The width W390 of the spacer 390 may vary from one end to the other, but the disclosure is not limited thereto. For example, the width W390 of the spacer 390 illustrated in FIG. 2 gradually decreases from an end close to the substrate 110 to an end close to the cover layer 140, and the spacer 390 may be, for example a trapezoid, but the disclosure is not limited thereto. In other embodiments, the width W390 of the spacer 390 may gradually increase from an end close to the substrate 110 to an end close to the cover layer 140, and the spacer 390 may be, for example, an inverted trapezoid, but the disclosure is not limited thereto. In some embodiments, the width W390 of the spacer 390 may remain identical from an end close to the substrate 110 to an end close to the cover layer 140. In addition, the height H390 of the spacer 390 may refer to the height H290 of the spacer 290 in FIG. 1. For example, the height H390 of the spacer 390 may be greater than the height H130 of the electronic component 130. The height H390 of the spacer 390 may be on the order of millimeters or sub-millimeters. In some embodiments, the spacer 390 may be fabricated by lithography. The material of the spacer 390 includes, for example, a photoresist material.

Figure 4:
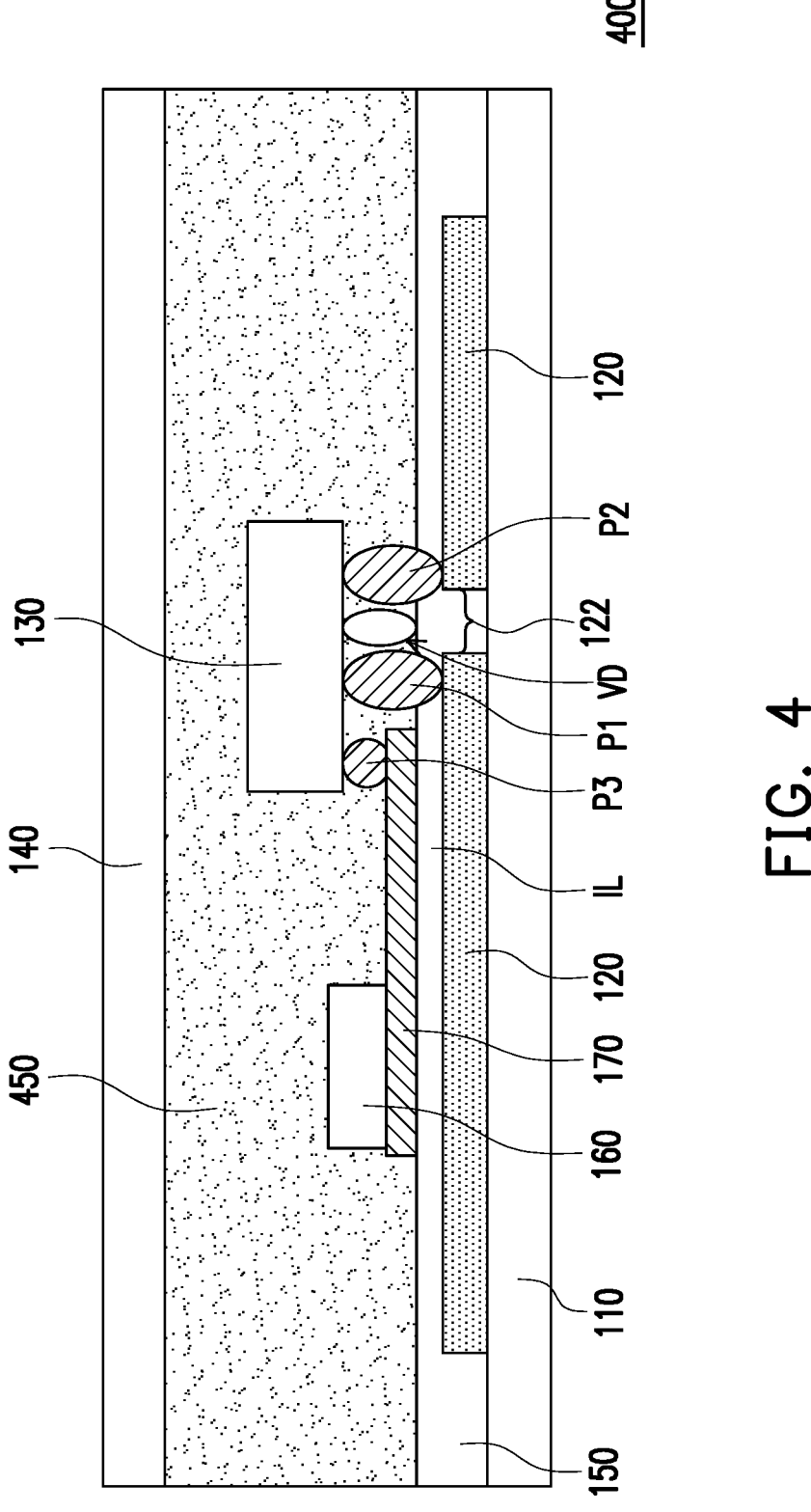
FIG. 4 is a schematic partial cross-sectional view of an electronic device according to an embodiment of the disclosure.

FIG. 4 is a schematic partial cross-sectional view of an electronic device according to an embodiment of the disclosure. The electronic device 400 of FIG. 4 is substantially similar to the electronic device 100 of FIG. 1, and the same reference numerals in the two embodiments may denote the same and/or similar elements, and one may be the reference of the other. The electronic device 400 includes a substrate 110, a first metal layer 120, an electronic component 130, a cover layer 140, an adhesive layer 450, a transistor 160, a second metal layer 170, and an insulating layer IL. The electronic device 400 is different from the electronic device 100 mainly in that the adhesive layer 450 of the electronic device 400 replaces the adhesive layer 150 and the filler 180 in FIG. 1. As shown in FIG. 4, the adhesive layer 450 is continuously disposed between the substrate 110 and the cover layer 140, and directly contacts the electronic component 130 and the transistor 160. For example, at least a portion of a surface of the cover layer 140 is in contact with at least a portion of a surface of the electronic component 130, but the disclosure is not limited thereto. The adhesive layer 450 may have a low dielectric constant (Dk) or a low dielectric loss (Df). In some embodiments, the adhesive layer 450 may include silicone, acrylic, or other glues. In some embodiments, the adhesive layer 450 may be an Ajinomoto build-up film (ABF) or a bismaleimide-triazine (BT). The adhesive layer 450 may fill the volume between the substrate 110 and the cover layer 140, but the disclosure is not limited thereto. For example, there may be voids VD between the bonding pads P1 to P3 below the electronic component 130, and the voids are not fully filled by the adhesive layer 450, but the disclosure is not limited thereto.

Figure 5:
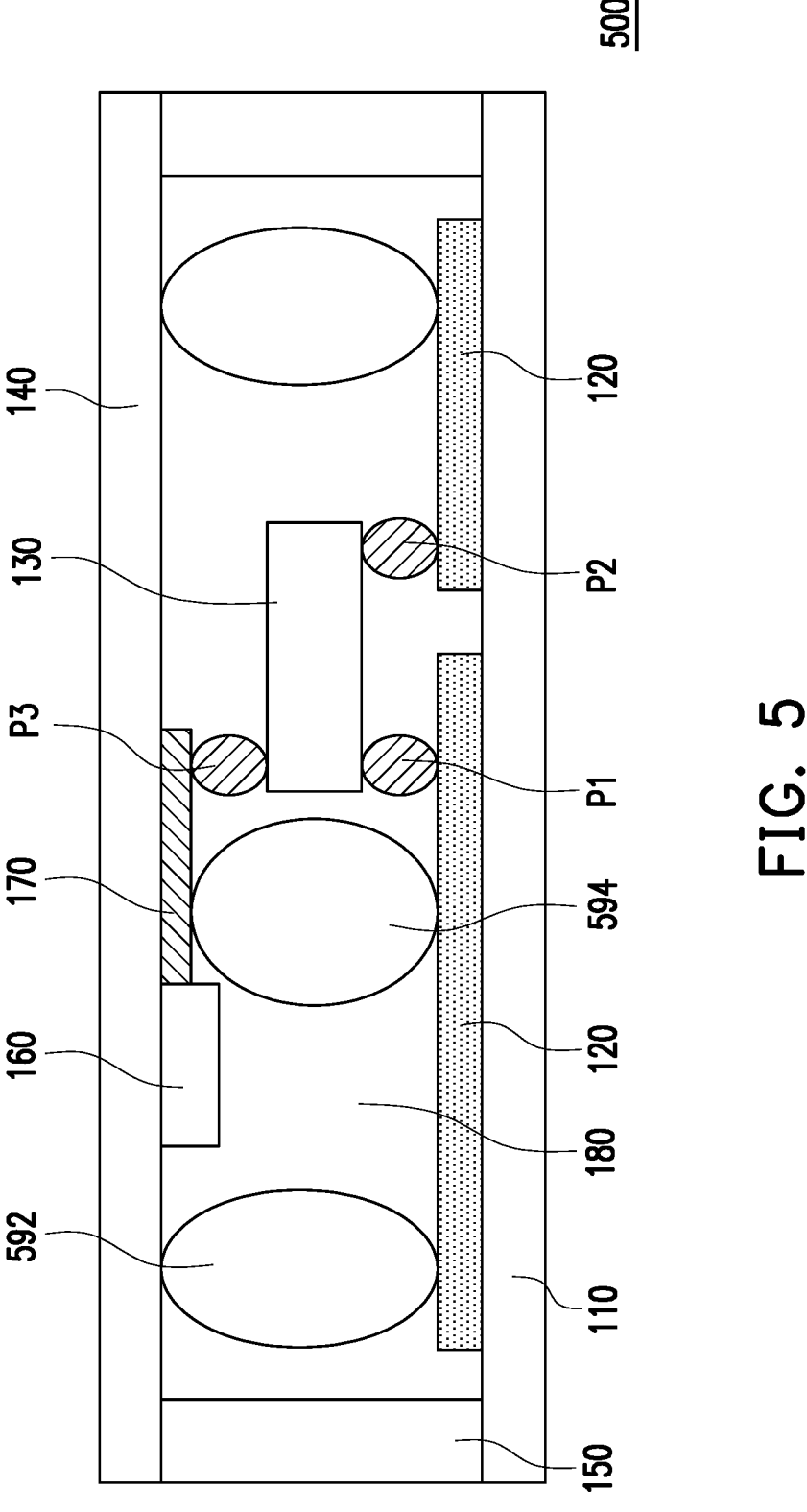
FIG. 5 is a partial cross-sectional schematic diagram of an electronic device according to an embodiment of the disclosure.

FIG. 5 is a partial cross-sectional schematic diagram of an electronic device according to an embodiment of the disclosure. The electronic device 500 of FIG. 5 is substantially similar to the electronic device 100 of FIG. 1, and the same reference numerals in the two embodiments may denote the same and/or similar elements, and one may be the reference of the other. The electronic device 500 includes a substrate 110, a first metal layer 120, an electronic component 130, a cover layer 140, an adhesive layer 150, a transistor 160, a second metal layer 170, and a filler 180. The electronic device 500 is different from the electronic device 100 mainly in that the transistor 160 and the second metal layer 170 of the electronic device 500 are formed on the cover layer 140, and that the electronic device 500 further includes a spacer 592 and a spacer 594.

In some embodiments, the electronic component 130 may be connected through the bonding pad P3 to the second metal layer 170 formed on the cover layer 140, the second metal layer 170 extends between the transistor 160 and the bonding pad P3, and the transistor 160 is electrically connected to the electronic component 130 through the second metal layer 170. In addition, the spacer 592 is disposed between the substrate 110 and the cover layer 140 to maintain the distance between the substrate 110 and the cover layer 140, and the spacer 594 is disposed between the first metal layer 120 and the second metal layer 170 to avoid short circuit between the two metal layers. The height of the spacer 592 may be greater than the height of the spacer 594. The spacer 592 and the spacer 594 are shown as spherical spacers in FIG. 5 as an example, but they are not limited thereto. In some embodiments, the spacer 592 and the spacer 594 may be columnar spacers (such as the spacers 390 in FIG. 3).

Figure 6:
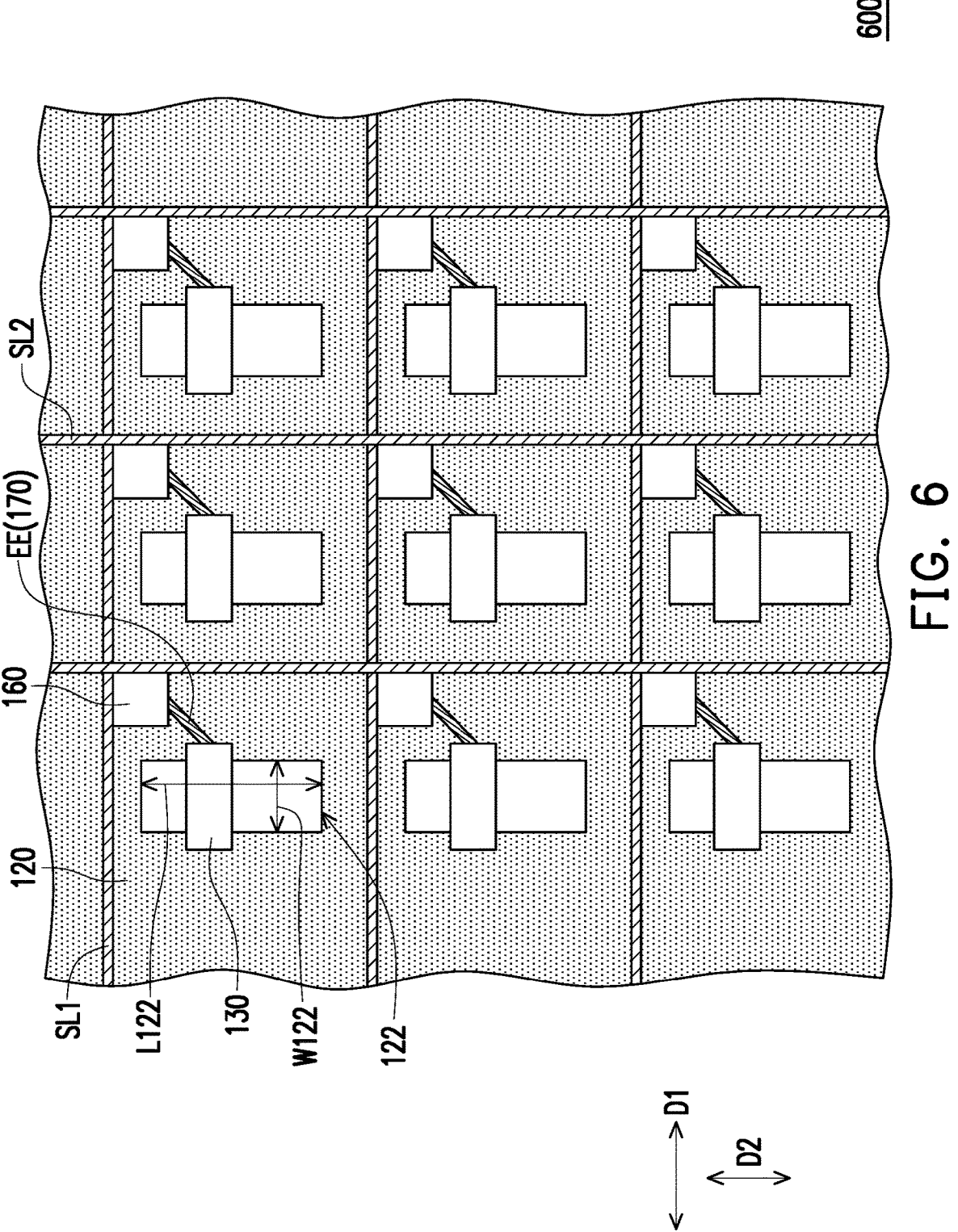
FIG. 6 is a schematic partial top view of an electronic device according to an embodiment of the disclosure.

FIG. 6 is a schematic partial top view of an electronic device according to an embodiment of the disclosure. FIG. 6 shows some of the components in the electronic device 600 for illustration. It should be understood that the electronic device 600 may include other components described in the foregoing embodiments, including the components not proposed herein. The electronic device 600 in FIG. 6 includes a first metal layer 120, a plurality of electronic components 130, a plurality of transistors 160, a second metal layer 170, a plurality of signal lines SL1, and a plurality of signal lines SL2. FIG. 6 may serve as an embodiment of the top view of the first metal layer 120, the electronic component 130, the transistor 160, and the second metal layer 170 in FIG. 1 to FIG. 5, but the disclosure is not limited thereto.

The first metal layer 120 has a plurality of openings 122. The width W122 of the opening 122 may be related to the wavelength of the electromagnetic wave to be transmitted and received by the electronic device 600. The opening 122 may have an elongated shape with a length L122 greater than a width W122. The openings 122 are shown to be disposed parallel to each other in FIG. 6 as an example, but the disclosure is not limited thereto. In some embodiments, the extending directions of the lengths L122 of the openings 122 may be disposed in different directions. For example, the extending directions of two adjacent openings 122 may intersect.

The electronic components 130 are respectively disposed to correspond to one of the openings 122, and each electronic component 130 may overlap one of the openings 122. In other words, in the top view shown in FIG. 6, the area of the electronic component 130 may overlap the area surrounded by the outline of the opening 122. As described in the foregoing embodiments, each electronic component 130 may be electrically connected to the first metal layer 120 through corresponding bonding pads (e.g., the aforementioned bonding pads P1 and P2). In addition, the second metal layer 170 may include a plurality of independent patterns EE, and each electronic component 130 may be electrically connected to a corresponding one of the transistors 160 through one of the patterns EE of the second metal layer 170. As such, each electronic component 130 may be independently controlled by one transistor 160.

The signal lines SL1 each extend along the first direction D1, and the signal lines SL2 each extend along the second direction D2. The signal lines SL1 and SL2 are disposed alternately. In some embodiments, the signal line SL1 transmits one of the scan signal and the data signal, and the signal line SL2 transmits the other one of the scan signal and the data signal. Each transistor 160 may be connected to one of the signal lines SL1 and one of the signal lines DL2. The signal line SL1, the signal line SL2, and the transistor 160 may thus form an active device array. In addition, the signal line SL1 and the signal line SL2 may be disposed in different conductive layers, and the two conductive layers are separated by corresponding insulating layers. In some embodiments, one of the signal line SL1 and the signal line SL2 may be in the same layer as the second metal layer 170, but the disclosure is not limited thereto. In some embodiments, the transistor 160 may be a thin film transistor composed of semiconductor layers, multilayer conductive layers, etc., and the conductive layer in the transistor 160 may be the same layer as at least one of the signal line SL1, the signal line SL2, and the second metal layer 170.

In summary, in the electronic device according to the embodiments of the disclosure, electronic components such as the electronic component are disposed between the substrate and the cover layer to protect the electronic components from moisture and/or oxidation. In addition, the electronic device of the embodiment of the disclosure further utilizes a filler or an adhesive layer to encapsulate the electronic components, which helps improve the protection of the electronic components.

Finally, note that the above embodiments are only used to illustrate the technical solutions of the present disclosure, but not to limit them. Although the present disclosure has been described in detail with reference to the foregoing embodiments, those of ordinary skill in the art should understand that it is possible to combine and modify the technical solutions described in the foregoing embodiments, or to replace some or all of the equivalent technical features. However, these combinations, modifications, or replacements do not deviate the essence of the corresponding technical solutions from the scope of the technical solutions of the embodiments of the present disclosure.

What is claimed is:

1. An electronic device, comprising:

a substrate;

a first metal layer, formed on the substrate, wherein the first metal layer occupies 80% to 90% of an area of the substrate;

an electronic component, disposed on the substrate and electrically connected to the first metal layer;

a cover layer; and an adhesive layer, adhered to the substrate and the cover layer.

2. The electronic device of claim 1, further comprising a transistor formed on at least one of the substrate and the cover layer and electrically connected to the electronic component.

3. The electronic device of claim 2, further comprising a second metal layer formed on the cover layer, wherein the transistor is formed on the cover layer and is electrically connected to the electronic component through the second metal layer.

4. The electronic device of claim 3, further comprising bonding pads, wherein the electronic component is connected to the bonding pads, and the second metal layer is disposed between at least one of the bonding pads and the transistor.

5. The electronic device of claim 1, further comprising a spacer disposed between the substrate and the cover layer.

6. The electronic device of claim 5, wherein a height of the spacer is greater than a height of the electronic component.

7. The electronic device of claim 1, wherein the electronic component contacts the cover layer.

8. The electronic device of claim 1, further comprising a filler interposed between the substrate and the cover layer.

9. The electronic device of claim 8, wherein the filler is air.

10. The electronic device of claim 8, wherein the filler is glue.

11. The electronic device according to claim 8, wherein the filler is an Ajinomoto build-up film.

12. The electronic device of claim 8, wherein the filler comprises a material with low dielectric loss.

13. The electronic device of claim 1, further comprising bonding pads, wherein the electronic component is electrically connected to the first metal layer through the bonding pads.

14. The electronic device of claim 1, wherein the electronic component is a varactor or an integrated circuit chip.

15. The electronic device of claim 1, wherein the adhesive layer is continuously disposed between the substrate and the cover layer, and the adhesive layer directly contacts the electronic component.

16. The electronic device of claim 1, wherein the first metal layer has a plurality of openings and the electronic component overlaps one of the openings.

17. The electronic device of claim 16, wherein the opening has an elongated shape, and a length of the opening is greater than a width of the opening.

18. The electronic device of claim 1, wherein the adhesive layer comprises a heat-curable glue or a light-curable glue.

19. An electronic device, comprising:

a substrate;

a first metal layer, formed on the substrate, wherein the first metal layer has a plurality of openings, the openings are closed patterns surrounded by a material of the first metal layer;

an electronic component, disposed on the substrate and electrically connected to the first metal layer, and the electronic component overlapping one of the openings;

a cover layer; and an adhesive layer, adhered to the substrate and the cover layer.

* * * * *